United States Patent
Paszkiet et al.

(10) Patent No.: US 6,391,678 B1
(45) Date of Patent: May 21, 2002

(54) METHOD FOR CONTROLLING SOLDERABILITY OF A CONDUCTOR AND CONDUCTOR FORMED THEREBY

(75) Inventors: Christine Ann Paszkiet; Christine Redder Coapman; Anthony John Stankavich, all of Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/344,971

(22) Filed: Jun. 28, 1999

(51) Int. Cl.[7] .................. H01L 21/44; H01L 21/48; H01L 21/50
(52) U.S. Cl. ............... 438/106; 438/608; 438/613; 438/615
(58) Field of Search ................ 438/608, 613, 438/615, 106

(56) References Cited

U.S. PATENT DOCUMENTS 3,823,469 A * 7/1974 Hegarty et al.
5,266,520 A * 11/1993 Cipolla et al.
5,808,360 A * 9/1998 Akram

OTHER PUBLICATIONS

U.S. application No. 08/887,064, filed Jul. 2, 1997.

* cited by examiner

*Primary Examiner*—John F. Niebling
*Assistant Examiner*—Josetta I. Jones
(74) *Attorney, Agent, or Firm*—Jimmy L. Funke

(57) ABSTRACT

A thick-film conductor, a method for forming the conductor, and a method for attaching a surface-mount circuit device to the conductor with a solder connection. The conductor is formed of a thick-film conductive ink that would normally produce a solderable conductor, but is rendered unsolderable by additions of a fine inorganic particulate material. A solderable region, preferably a pillar, is then selectively formed on the unsolderable conductor to determine the distribution and height of the solder connection on the conductor. In order to suitably affect the solderability of the conductor, the particulate material is present as a fine dispersion and in a sufficient quantity, but not in quantities that significantly affect the electrical, mechanical and processing characteristics of the conductor.

20 Claims, 2 Drawing Sheets

METHOD FOR CONTROLLING SOLDERABILITY OF A CONDUCTOR AND CONDUCTOR FORMED THEREBY

TECHNICAL FIELD

The present invention generally relates to electrical conductors of the type formed on substrates. More particularly, this invention relates to a method for reducing the solderability of a thick-film conductor without significantly affecting its electrical, processing and mechanical properties, so that the shape and height of a solder connection between a surface-mount (SM) circuit device and the conductor can be controlled with a solderable pillar formed on the conductor.

BACKGROUND OF THE INVENTION

Flip chips, ball grid arrays (BGAs), wire bond pads, chip resistors and chip capacitors are examples of surface-mount devices, i.e., discrete circuit devices mounted to the surface of a substrate, such as a printed circuit board (PCB), printed wiring board (PWB), flexible circuit, or a silicon, ceramic or insulated metal substrate. These devices rely on solder connections to both secure the chip to a substrate and electrically interconnect the device to conductors formed on the substrate. The size of a flip chip is generally on the order of a few millimeters per side, while bond pads, chip capacitors and resistors are typically smaller. As a result, the conductors required for surface-mount devices are narrow, e.g., line widths of about 0.5 millimeter or less, and typically spaced apart about 0.5 millimeter or less. While conductors can be formed by various methods such as plating and etching techniques, thick-film conductors are most often used in hybrid microcircuits.

Because of the small size of the solder connections, soldering a surface-mount device to its conductor pattern requires a significant degree of precision. Reflow solder techniques are widely employed for this purpose, and typically entail precisely depositing a controlled quantity of solder using methods such as printing and electrodeposition. For smaller surface-mount devices, such as chip resistors and capacitors, the chip is soldered to its conductors by registering terminals formed on the chip with solder deposited on the conductors, and then reheating, or reflowing, the solder so as to form a "solder column" that metallurgically adheres and electrically interconnects the chip to the conductors, yielding what will be referred to herein as a solder connection. When mounting flip chips and BGAs, solder is typically deposited on bond pads on the chip and then heated above its liquidus temperature to yield "solder bumps." After cooling to solidify the solder bumps, the chip is soldered to the conductor pattern by registering the solder bumps with their respective conductors and then reflowing the solder to form solder connections.

Placement of the chip and reflow of the solder must be precisely controlled not only to coincide with the spacing of the terminals and the size of the conductors, but also to control the orientation of smaller surface-mount devices and the height of flip chip solder connections after soldering. As is well known in the art, smaller chips are prone to twisting and tilting during reflow as a result of the device floating on the surface of the molten solder, while controlling the height of flip chip solder connections after reflow is often necessary to prevent the surface tension of the molten solder bumps from drawing the flip chip excessively close to the substrate during the reflow operation. Sufficient spacing between a flip chip and its substrate, which may be termed the "stand-off height," is desirable for enabling stress relief during thermal cycles, allowing penetration of cleaning solutions for removing undesirable processing residues, and enabling the penetration of mechanical bonding and underfill materials between the chip and its substrate.

The position and height of a solder column of a discrete component can be controlled by limiting the surface area over which the printed solder is allowed to reflow on a conductor. FIG. 1 is a longitudinal cross-sectional view of a conductor 12 on a circuit substrate 10, and shows the use of solder stops 14 to limit the flow of molten solder on the conductor 12. The solder stops 14 can be formed by a solder mask or printed dielectric, and extend widthwise across the surface 18 of the conductor 12. A solder bump 16 of a surface-mount device (not shown) is shown as being registered with the surface 18 of the conductor 12, as would be the case prior to reflow. The solder stops 14 delineate a rectangular-shaped area on the surface 18 of the conductor 12 over which the solder is able to flow during reflow. By properly locating the solder stops 14 on the conductor 12, the degree to which the molten solder can spread during reflow is controlled, which in turn determines the height of the solder connection and therefore the stand-off height of the device relative to the substrate 10.

Because the solder bump 16 is registered and soldered directly to the conductor 12, the conductor 12 must be formed of a solderable material, which as used herein means that a tin, lead or indium-based alloy is able to adhere to the conductor 12 through the formation of a strong metallurgical bond. In contrast, the solder stops 14 are intentionally formed of an unsolderable material, meaning that a tin, lead or indium-based solder will not adhere to the material for failure to form a strong metallurgical bond. While solder stops are widely used in the art, trends in the industry have complicated their ability to yield solder connections that exhibit adequate reliability for small discrete components, such as flip chips, chip capacitors and chip resistors. One trend is toward the use of low-melting, high-tin (e.g., 60Sn-40Pb) solders that are relatively brittle. Thermal cycle reliability problems can occur when a brittle solder solidifies against a solder stop used to contain the solder during reflow, and there is a tendency for fatigue fracturing to occur during thermal cycling at the junction between the conductor, solder and solder stop.

FIG. 2 illustrates an alternative to the use of solder stops in accordance with U.S. Pat. No. 5,926,732 to Coapman et al., assigned to the assignee of the present invention. Coapman et al. disclose forming a conductor 112 of an unsolderable thick-film conductive material, and then forming a solderable pillar 114 on the surface 118 of the conductor 112, to which a solder bump 116 of a surface-mount device (not shown) is then registered. According to Coapman et al., when the solder bump 116 is reflowed, the molten solder alloy will coalesce on the pillar 114, such that the pillar 114 determines the placement and height of the resulting solder connection on the conductor 112 following reflow. The pillar 114 can be appropriately sized and shaped to ensure that the solder bump 116 will form a connection having an adequate height for allowing an underfill material to flow between the device and the substrate 110 on which the conductor 112 is formed. Solder connections formed in accordance with Coapman et al. have been shown to exhibit significantly improved reliability for small discrete components having fine pitch terminal patterns.

A complication with implemting the teachings of Coapman et al. has been the limited availability of thick-film conductive materials that are unsolderable, i.e., to which a tin, lead or indium-based solder will not adhere to form a strong metallurgical bond. In hybrid circuits, thick-film conductors based on silver-platinum and silver-palladium alloys are often preferred for their electrical, mechanical and processing characteristics. However, most of these alloys form strong metallurgical bonds with solder alloys, and therefore cannot be used with the teachings of Coapman et al. Nontheless, it would be desiable if thick-film conductive materials having the desirable electrical, mechanical and processing characteristics of silver-platinum and silver-palladium alloys could be used with the teachings of Coapman et al.

SUMMARY OF THE INVENTION

The present invention provides a conductor, a method for forming the conductor, and a method for attaching a surface-mount circuit device, such as a chip capacitor, chip resistor or bond pad, to the conductor with solder connections. The invention utilizes the pillars taught by Coapman et al. to form solder connections that are characterized as being accurately located on the conductor and having a shape that achieves an adequate stand-off height for the device, promotes stress relief during thermal cycling, and reduces the likelihood that the device will twist and tilt during reflow.

According to this invention, the thick-film conductor is formed of a conductive ink that would normally produce a solderable conductor, but is rendered unsolderable by additions of a fine particulate inorganic material. The inorganic material is present as a fine dispersion and in a sufficient quantity within the conductor to inhibit the formation of a strong metallurgical bond between the conductor and a tin, lead or indium-based solder alloy, but not in quantities that significantly affect the electrical, mechanical and processing characteristics of the conductor. For this reason, the inorganic material is preferably processed to include a surfactant coating that inhibits agglomeration, and is limited to about 4 weight percent of total solids of the conductive ink. After printing, drying and firing using any suitable methods, the thick-film conductive ink yields a thick-film electrical conductor having reduced solderability as compared to a thick-film electrical conductor formed only of the conductive ink with no additives.

In view of the above, the present invention enables the use of thick-film conductive inks based on solderable metals, including commercially-available silver, silver-platinum and silver-palladium alloys, to form unsolderable conductors having desirable electrical, mechanical and processing characteristics. A conductive ink can be rendered sufficiently unsolderable so that, when a solderable pillar is formed on an unsolderable conductor formed of the ink and a solder bump is registered and reflowed on the pillar, the molten solder alloy will coalesce only on the pillar. As a result, the pillar determines the placement and height of the resulting solder connection on the conductor following reflow. An appropriately sized and shaped pillar on the unsolderable conductor can ensure that the solder bump will form a connection having an adequate height to allow an underfill material to flow between a surface mount device and substrate. The invention achieves the above without the use of conventional solder stops that overlie the conductor. Accordingly, conductors and solder connections of this invention are not susceptible to the same problems with contamination, underfill voiding and stress raisers that can reduce the reliability and durability of prior art connections made using solder stops. In addition, the increased chip height made possible with this invention as a result of tighter control of solder during reflow reduces the mechanical stresses on the chip connection and increases the reliability of the attachment.

Other objects and advantages of this invention will be better appreciated from the following detailed description.

DESCRIPTION OF THE PREFERRED EMBODIMENT

With reference again to FIG. 2, a solder bump 116 of a surface-mount device (not shown) is shown registered with a solderable pillar 114 on an unsolderable conductor 112 in accordance with this invention and U.S. Pat. No. 5,926,732 to Coapman et al. As shown, the solder bump 116 is as it generally appears prior to a solder reflow operation, during which the solder bump 116 melts, coalesces on the pillar 114 and then, upon resolidifying, metallurgically bonds to the pillar 114, producing the solder connection with a generally columnar shape between the pillar 114 and the surface-mount device. This invention is applicable to essentially any surface-mount component, including wire bond pads, chip capacitors, chip resistors, flip chips and BGAs. Accordingly, benefits arising from this invention can be realized for essentially any application in which solder must be reflowed on a conductor.

Figure 1:
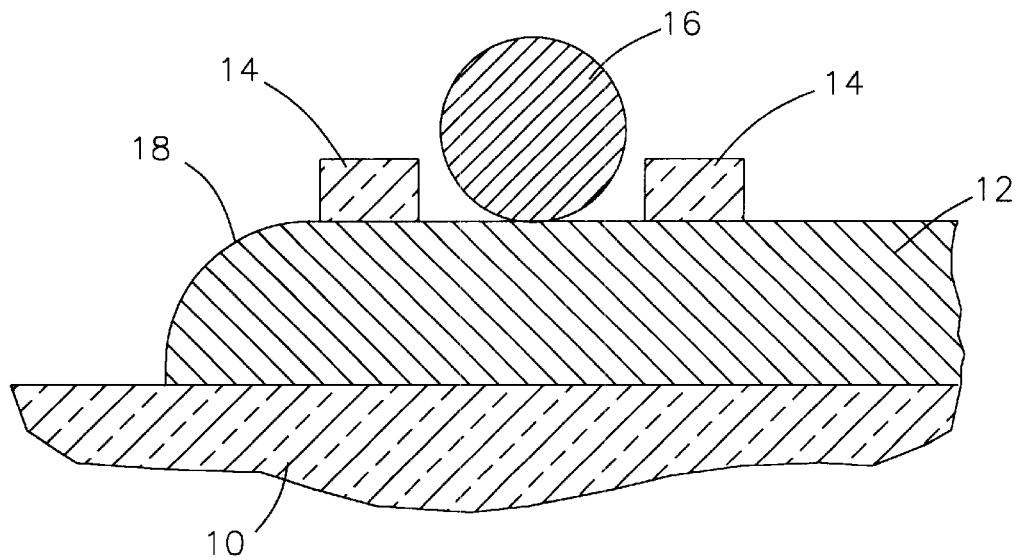
FIG. 1 is a cross-sectional view of a solder bump registered with a solderable thick-film conductor having solder stops in accordance with the prior art.
Figure 2:
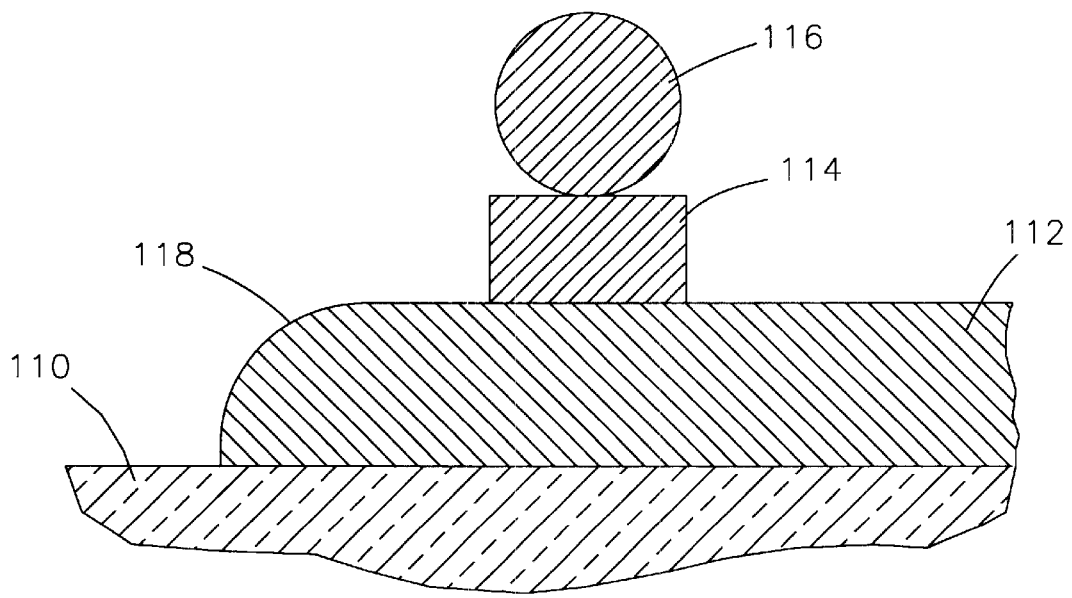
FIG. 2 is a cross-sectional view of a solder bump registered with a solderable pillar on an unsolderable thick-film conductor in accordance with the present invention.

The conductor 112 shown in FIG. 2 has been printed or otherwise formed on a substrate 110, which may be a printed circuit board (PCB), printed wiring board (PWB), flexible circuit, or a silicon, ceramic or insulated metal substrate, as is known in the art. According to the invention, the conductor 112 is formed of a solderable thick-film conductive ink that has been modified to render the conductor 112 generally unsolderable. As a result, during reflow the molten solder bump 116 coalesces on the solderable pillar 114, but is inhibited from flowing onto the conductor surface 118 surrounding the pillar 114. As the molten solder alloy coalesces during reflow, the surface tension of the molten solder alloy constrains the final shape of the solder connection in accordance with the surface area of the pillar 114, such that a smaller pillar 114 can be employed to promote the height of the solder bump connection. Consequently, the pillar 114 dictates both the location and height of the solder connection on the conductor 112. The accuracy with which the pillar 114 can be formed by printing or photoimaging techniques yields solder connections whose size and height can be more precisely and readily obtained than is possible with prior art solder stops of the type illustrated in FIG. 1.

As is conventional for electronic applications, the solder bump 116 may be a tin-based, lead-based or indium-based solder alloy that can be at sufficiently low temperatures to avoid thermal damage to the surface mount device. According to this invention, the pillar 114 must be formed of a solderable material, and preferably a thick-film conductive ink. The conductor 112 is also formed of a thick-film conductive ink that would normally produce a solderable conductor, but is rendered unsolderable as a result of the ink composition being modified to include limited amounts of an unsolderable inorganic material present as a uniform dispersion of very fine particles, as will be discussed in greater detail below. As used herein, the term "unsolderable" denotes a material to which tin and lead-base solders will not metallurgically bond and reliably adhere for purposes of making an electrical interconnection, while "solderable" denotes a material to which such solders will metallurgically bond and reliably adhere. The definition for "solderable" applies to various materials known to those skilled in the art, including various silver, silver-platinum and silver-palladium alloys used to form thick film conductors. Notable examples of commercially available thick-film conductive ink compositions include 7484, QS170, QS170, QS170X, QS179 and Q170P, each of which is available from E.I. DuPont de Nemours and Company, Inc., of Wilmington, Del. DuPont 7484 is based on a silver-palladium alloy, while the remaining compositions are based on silver-platinum alloys. The QS170X ink is specially formulated for fine-printing applications, while Q170P is a photoimageable ink, which enables conductor traces formed of this ink to be photodefined with considerable precision.

Conductors formed of thick-film inks modified in accordance with the invention must not only be capable of reducing the solderability of the conductors, but must also have minimal adverse effect on the electrical, mechanical and processing characteristics of the conductors. For example, the inks must be capable of being printed or photo-imaged to form fine pitch conductors whose electrical conductivities are not significantly reduced by the presence of the unsolderable additives. During several investigations leading to this invention, it was determined that the inorganic additive to the ink must be present in limited amounts and as a uniform dispersion of very fine particles. In one investigation, alumina (aluminum oxide) particles having a size of about 0.84 micrometers were blended with the Q170P ink in an amount of about 6.5 weight percent of total solids. The alumina particles were found to form large agglomerates that caused surface flaws in the conductors and shorts between conductors as a result of the agglomerates shielding the thick-film ink during photo-processing. In an ensuing investigation directed to avoiding the formation of alumina agglomerates, an alumina powder having a particle size on the order of about one micrometer was jar milled for about 300 hours and then passed through a 500 mesh screen. A precursor paste was then formed by mixing the fine milled powder with about 24.1 weight percent of DuPont 8250 (terpineol) as an organic medium and about 3.6 weight percent of a mixture of ethylene oxide and propylene oxide as a surfactant, and then three-roll milling the paste at a pressure of about 30 psi (about 200 kPa) for a duration of about two minutes until the alumina particles were well mixed and coated with the surfactant. Various amounts of the paste were then added to the Q170P thick-film ink and roll-milled at a pressure of about 5 to 10 psi (about 34 to 69 kPa) for a duration of about one minute until well mixed. Lower roll pressures were used when mixing the paste with the ink in order to avoid deforming the relatively soft metal particles in the ink. The inks were then printed, dried at about 70° C. for about ten minutes, photoimaged in a known manner to define traces having widths of about two to ten mils (about 50 to 250 $\mu$m), and then fired at about 850° C. to volatilize or burn off the organic medium and surfactant and to fuse the remaining constituents of the ink and form thick-film conductors.

Table I below presents data obtained from thick-film conductors produced in accordance with the above procedure and containing four different amounts of alumina additive (Specimens A, B, C and D), as well as baseline conductors formed of unmodified Q170P ink. Indicated in Table I are the amounts of alumina present in weight percent of total solids, and the thickness, conductivity and solderability of the conductors. Conductivity was measured using a 500 square serpentine trace, with the data reported in milli-ohms per square. Solderability was measured using a Multicore wetting balance solderability tester, 60Sn-40Pb solder and a standard 96% alumina test substrate. In the wetting balance test, conductor-coated substrates of precisely known size were immersed in a bath of molten solder up to a specified level, and the wetting force exerted on the sample by the molten solder as it wets the conductor is measured. Higher wetting balance values correspond to higher solderability. The first column ("Ink") under "Solderability" reports the average solderability for the ink specimens of each ink composition, while the second column ("Overprint") reports the average solderability of unmodified Q170P conductors printed over the modified Q170P conductors and then fired a total of five times. The latter test was conducted to evaluate the potential influence that a modified ink might have on the solderability of any overlying conductor, as would be the case with a solderable pillar 114 on an unsolderable conductor 112 as shown in FIG. 2.

TABLE I

| Ink Specimen | Alumina (wt. %) | Thickness ($\mu$m) | Conductivity (m$\Omega$/sq.) | Solderability (mN) Ink | Overprint |
|---|---|---|---|---|---|
| Q170P | 0.00% | 8.1 | 4.46 | 15.77 | 14.85 |
| A | 1.21 | 9.1 | 4.92 | −0.72 | N/A |
| B | 2.36 | 9.1 | 5.50 | −5.14 | 17.51 |
| C | 3.52 | 9.7 | 6.10 | −7.43 | 16.74 |
| D | 4.61 | 9.1 | 6.82 | −7.79 | 16.36 |

The data in Table I indicate that the conductivity decreased as the alumina content increased. The solderability data for the modified inks demonstrated that even the smallest addition of alumina significantly decreased the solderability of the resulting conductor, with an alumina content of about 1 weight percent or more appearing to have a noticeable effect on solderability to be useful. The "Overprint" solderability data indicated that solderability should remain high for a solderable conductor printed over a conductor modified to be unsolderable in accordance with this invention. The solderability of the overprinted unmodified inks was higher than that of the Q170P control specimen. Accordingly, the solderability of a solderable ink used to form pillar 114 on an unsolderable conductor 112 (FIG. 2) formed in accordance with this invention would not be degraded, and might even improve.

Figure 3:
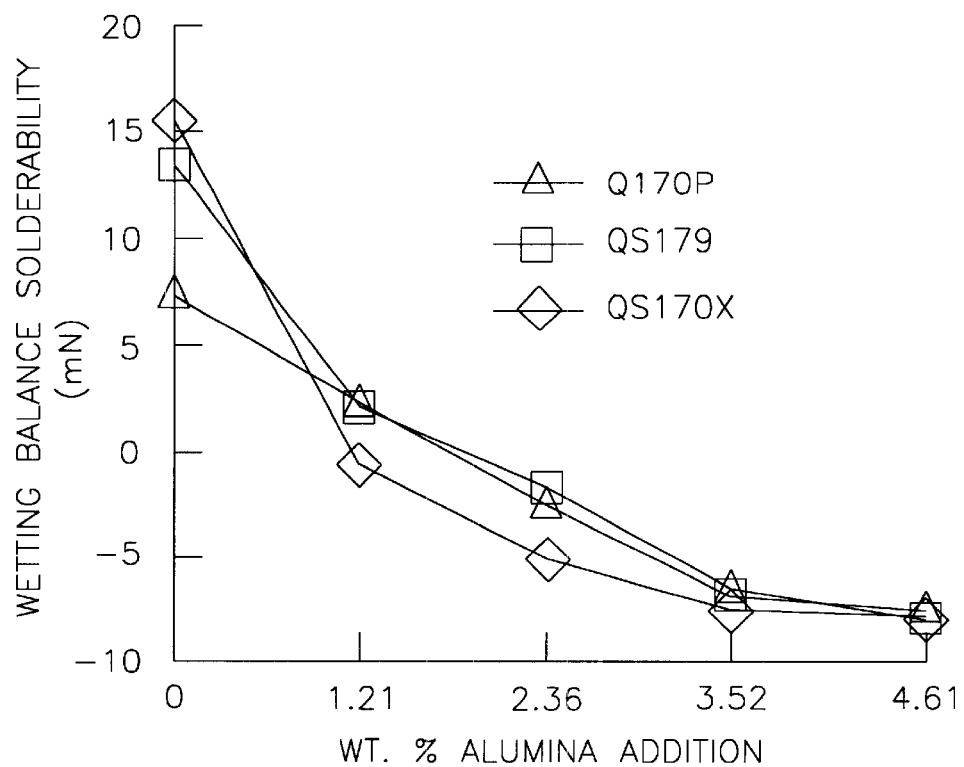
FIGS. 3 and 4 are graphs that show the effect that alumina content has on the solderability and conductivity, respectively, of thick-film conductors formed in accordance with this invention.
Figure 4:
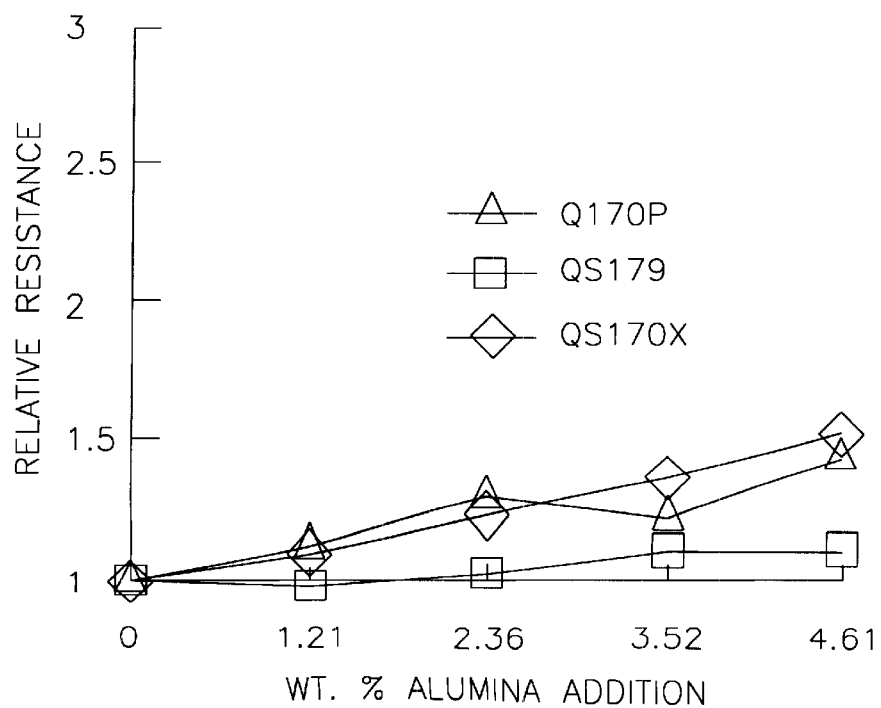

FIGS. 3 and 4 are graphs showing the solderability and relative resistance data for the specimens described above as well as for identical tests conducted on essentially identical specimens prepared using the QS179 and QS170X inks. The alumina additive was processed in the same manner as described above, including the milling parameters, particle size and surfactant and organic medium used. Again, it can be seen that solderability of the normally solderable Q170P, QS179 and QS170X silver-platinum inks decreased rapidly with the addition of alumina, though a reduced effect became evident as the alumina content was increased above about 3.5 weight percent of total solids. Conductivity can also be seen to generally decrease with increasing alumina content. Using a 40% increase in resistivity as an acceptable upper limit, a suitable range for alumina content was concluded to be above 1 weight percent to about 4 weight percent, with a preferred range being about 1.2 to about 2.4 weight percent.

An investigation was then undertaken to evaluate the effect of thermal cycling on the adhesion of solder to conductors formed of unmodified solderable ink printed on unsolderable conductors formed in accordance with this invention. Wire lead peel tests were conducted with tinned copper wires soldered with 60Sn-40Pb solder to solderable Q170P conductors printed on modified (unsolderable) Q170P conductors. Adhesion was determined by a peel test in which the wires were pulled in a direction normal to the substrates on which the conductors were printed. The specimens for this investigation were the same inks used for the specimens whose conductivity and solderability data are reported in Table I. Adhesion of five specimens was measured prior to testing ("Initial") while five others were tested after the number of thermal cycles reported in Table II. Each thermal cycle consisted of an eighty minute cycle between −50° C. and +150° C. The results under the column entitled "Fast Test" were obtained with specimens that were stored at about 150° C. for forty-eight hours prior to undergoing thirty-six thermal cycles.

TABLE II

| Ink Specimen | Alumina (wt. %) | Initial (N) | Fast Test (N) | 50 (N) | 250 (N) |
| --- | --- | --- | --- | --- | --- |
| Q170P | 0.00% | 18.64 | 6.07 | 13.62 | 4.24 |
| A | 1.21 | 16.94 | 5.03 | 13.08 | 4.68 |
| B | 2.36 | 17.26 | 5.36 | 12.29 | 4.98 |
| C | 3.52 | 13.47 | 0.0 | 11.74 | 3.69 |
| D | 4.61 | 17.42 | 0.0 | 14.57 | 5.39 |

The data in Table II indicate that the adhesion of a 60Sn40Pb solder to solderable conductors printed on an unsolderable conductor of this invention is moderately affected by alumina contents of less than about three weight percent, and that adhesion may even improve when thermal cycled. However, adhesion appears to detrimentally decrease for alumina contents above three weight percent.

While the above tests were conducted with certain silver-platinum and silver-palladium conductive inks, it is believed that the invention is generally applicable to any solderable ink composition, including silver, silver-platinum and silver-palladium thick films. Furthermore, though 60Sn40Pb solder alloy was used in the investigations, similar results would be expected for other solder alloys, such as tin-lead alloys containing about 10 to about 60 percent tin, with possible alloying additions of antimony or silver. Finally, and as noted above, the choice of inorganic additive, organic medium and surfactant, the method of mixing the organic medium, surfactant and inorganic additive, the amount of inorganic additive used, and the method of adding the mixture of organic medium, surfactant and inorganic additive to a conductive ink are important to the success of the present invention. While DuPont 8250 was used as the organic medium, similar results could be expected using another commercially-available terpineol, as well as other suitable organic mediums. A suitable organic medium content for the precursor paste is believed to be the minimum required to allow sufficient mixing of the precursor paste, with about 25 weight percent being suitable. Similarly, while a mixture of ethylene oxide and propylene oxide was used as the surfactant, similar results could be expected using other known polar/nonpolar surfactants that are compatible with the inorganic of choice. Finally, though alumina was the additive used primarily in the investigations reported above, it is believed that similar results could be obtained with silica and other metal oxides such as zirconia.

Therefore, while the invention has been described in terms of particular embodiments, it is apparent that other forms could be adopted by one skilled in the art. Accordingly, the scope of the invention is to be limited only by the following claims.

What is claimed is:

1. A method of forming a thick-film electrical conductor with reduced solderability, the method comprising the steps of:
    combining an organic medium, a surfactant and metal oxide particles to coat the particles with the surfactant and yield a paste that is substantially free of agglomerates of the particles;
    forming a thick-film conductive ink by combining the paste with a conductive ink composition, the particles constituting up to about 4 weight percent of total solids of the thick-film conductive ink;
    printing the thick-film conductive ink on a substrate;
    drying the thick-film conductive ink, and then firing the thick-film conductive ink to yield a thick-film electrical conductor, the thick-film conductive ink containing a sufficient amount of the particles so that the thick-film electrical conductor has a lower solderability as compared to a thick-film electrical conductor formed only of the conductive ink composition.

2. A method as recited in claim 1, wherein the particles are alumina.

3. A method as recited in claim 1, wherein the conductive ink composition contains a metallic constituent selected from the group consisting of silver-palladium and silver-platinum alloys.

4. A method as recited in claim 1, wherein the thick-film conductive ink is photoimageable, the method further comprising the step of photoimaging and developing the thick-film conductive ink after the drying step and before the firing step.

5. A method as recited in claim 1, wherein the particles have a mesh size of up to 500, and wherein the step of combining the organic medium, surfactant and particles and the step of forming the thick-film conductive ink are performed by roll milling, the organic medium, surfactant and particles being roll milled at a first pressure that is sufficiently high to break up agglomerates of the particles, the thick-film conductive ink being roll milled at a second pressure that is sufficiently low to prevent deforming a metal particulate constituent of the conductive ink composition, the first pressure being higher than the second pressure.

6. A method as recited in claim 1, wherein the particles constitute at least 1 weight percent of total solids of the thick-film conductive ink.

7. A method as recited in claim 1, wherein the particles constitute more than 1 weight percent and less than 3 weight percent of total solids of the thick-film conductive ink.

8. A method as recited in claim 1, wherein the particles constitute about 1.2 to about 2.4 weight percent of total solids of the thick-film conductive ink.

9. A method as recited in claim 1, wherein the surfactant comprises ethylene oxide and propylene oxide.

10. A method as recited in claim 1, further comprising the steps of:
    forming a solderable conductor pillar on the thick-film electrical conductor;
    registering a solder bump of a surface mount device with the solderable conductor pillar; and then reflow soldering the surface mount device to the solderable conductor pillar, wherein molten solder is inhibited from flowing onto the thick-film electrical conductor due to the presence of the particles in the thick-film electrical conductor.

11. The thick-film electrical conductor formed by the method of claim 10.

12. The thick-film electrical conductor formed by the method of claim 1.

13. A method comprising the steps of:

roll milling an organic medium, a surfactant and alumina particles to coat the particles with the surfactant, the roll milling step being performed at a first pressure that is sufficiently high to break up agglomerates of the particles and yield a paste that is substantially free of agglomerates of the particles, the particles having a mesh size of 500 or less;

forming a thick-film conductive ink by roll milling the paste with a conductive ink composition containing a metal particulate constituent, the roll milling of the paste and the conductive ink composition being performed at a second pressure that is lower than the first pressure and sufficiently low to prevent deforming the metal particulate constituent of the conductive ink composition, the particles constituting at least 1 and less than 4 weight percent of total solids of the thick-film conductive ink;

printing the thick-film conductive ink on a substrate;

drying the thick-film conductive ink;

firing the thick-film conductive ink to yield a thick-film electrical conductor, forming a solderable conductor pillar on the thick-film electrical conductor;

registering a solder bump of a surface mount device with the solderable conductor pillar; and then reflow soldering the surface mount device to the solderable conductor pillar, wherein molten solder is inhibited from flowing onto the thick-film electrical conductor due to the presence of the particles in the thick-film electrical conductor.

14. A method as recited in claim 13, wherein the metal particulate constituent is selected from the group consisting of silver-palladium and silver-platinum alloys.

15. A method as recited in claim 13, wherein the thick-film conductive ink is photoimageable, the method further comprising the step of photoimaging and developing the thick-film conductive ink after the drying step and before the firing step.

16. A method as recited in claim 13, wherein the particles constitute more than 1 weight percent and less than 3 weight percent of total solids of the thick-film conductive ink.

17. A method as recited in claim 13, wherein the particles constitute about 1.2 to about 2.4 weight percent of total solids of the thick-film conductive ink.

18. A method as recited in claim 13, wherein the organic medium is terpineol and the surfactant comprises a mixture of ethylene oxide and propylene oxide.

19. A method as recited in claim 13, wherein the step of combining the organic medium, surfactant and particles and the step of forming the thick-film conductive ink are performed by roll milling, the organic medium, surfactant and particles being roll milled at a first pressure that is sufficiently high to break up agglomerates of the particles, the thick-film conductive ink being roll milled at a second pressure that is sufficiently low to prevent deforming the metal particulate constituent of the thick-film conductive ink, the first pressure being higher than the second pressure.

20. The thick-film electrical conductor formed by the method of claim 13.

* * * * *